United States Patent
Yamamoto et al.

(10) Patent No.: US 7,605,522 B2
(45) Date of Patent: Oct. 20, 2009

(54) PIEZOELECTRIC DEVICE

(75) Inventors: Atsushi Yamamoto, Yasu (JP); Yoichi Deguchi, Yasu (JP); Koichi Hayashi, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/948,734

(22) Filed: Nov. 30, 2007

(65) Prior Publication Data

US 2008/0074004 A1 Mar. 27, 2008

Related U.S. Application Data

(63) Continuation of application No. PCT/JP2006/308564, filed on Apr. 24, 2006.

(30) Foreign Application Priority Data

Jun. 3, 2005 (JP) .............................. 2005-164349

(51) Int. Cl.
*H01L 41/187* (2006.01)
(52) U.S. Cl. ..................................... 310/358
(58) Field of Classification Search ................. 310/328, 310/311, 358, 363, 366; 252/62.9 PZ; *H01L 41/187*
See application file for complete search history.

(56) References Cited

U.S. PATENT DOCUMENTS

| | | | |
|---|---|---|---|
| 6,734,607 B2 | 5/2004 | Nagaya et al. | |
| 6,806,625 B2* | 10/2004 | Ogawa et al. | 310/358 |
| 7,045,075 B2 | 5/2006 | Kasukawa et al. | |
| 7,067,965 B2* | 6/2006 | Sasaki et al. | 310/358 |
| 2002/0098333 A1 | 7/2002 | Feltz et al. | |
| 2004/0129919 A1 | 7/2004 | Horikawa et al. | |
| 2006/0251911 A1 | 11/2006 | Feltz et al. | |

FOREIGN PATENT DOCUMENTS

| | | |
|---|---|---|
| JP | 2004-300009 A | 10/2004 |
| JP | 2005-136260 A | 5/2005 |

OTHER PUBLICATIONS

Official communication issued in the International Application No. PCT/JP2006/308564, mailed on Jul. 18, 2006.
Official communication issued in counterpart Chinese Application No. 200680019707.0, mailed on Feb. 13, 2009.

* cited by examiner

*Primary Examiner*—Quyen P Leung
*Assistant Examiner*—Karen B Addison
(74) *Attorney, Agent, or Firm*—Keating & Bennett, LLP

(57) ABSTRACT

A piezoelectric device is formed by simultaneously firing a piezoelectric ceramic mainly composed of a perovskite complex oxide represented by general formula $ABO_3$ and electrodes mainly composed of copper. The piezoelectric ceramic is represented by $Pb_{\alpha-a}Me_a[(M^{II}_{1/3}M^{V}_{(2+b)/3})_z Ti_x Zr_{1-x-z}]O_3$ (wherein Me represe element, $M^{II}$ is an acceptor element which is a divalent metal element, and $M^V$ is a donor element which is a pentavalent metal element), and satisfies equations $0.05 \leq z \leq 0.40$, $0 < bz/3 \leq 0.035$, $0.345 \leq x \leq 0.480$, $0.965 \leq \alpha \leq 1.020$, and $0 \leq a \leq 0.05$. In other words, the B sites contain excessive donors, and thus a piezoelectric device having good piezoelectric characteristics can be obtained even in the cases where a base metal material mainly composed of inexpensive copper is used as the internal electrode material.

10 Claims, 2 Drawing Sheets

PIEZOELECTRIC DEVICE

BACKGROUND OF THE INVENTION

1. Field of the Invention

The present invention relates to piezoelectric devices, in particular, to a piezoelectric device, such as a piezoelectric actuator, including a piezoelectric ceramic containing a perovskite complex oxide as a main component and electrodes containing copper as a main component.

2. Description of the Related Art

Piezoelectric actuators that utilize electrostrictive effects generated by the application of voltage to piezoelectric ceramics are commonly used for alignment of precision machine tools and in print heads of ink jet printers.

A piezoelectric device used as such a piezoelectric actuator is typically fabricated by applying, by printing, a conductive paste on ceramic green sheets containing piezoelectric ceramic powder to form conductive layers, stacking a predetermined number of ceramic green sheets with the conductive layers thereon, simultaneously firing the conductive layers and the ceramic green sheets to form a piezoelectric ceramic compact including co-sintered piezoelectric ceramic and internal electrodes, and then forming external electrodes on side surfaces of the piezoelectric ceramic compact.

In this type of piezoelectric device, a noble metal material, such as Ag—Pd alloys, having high melting points and not readily oxidizable in a high-temperature, oxidizing atmosphere has been used as the material for the internal electrodes.

However, the use of noble metal materials as the internal electrode material increases the cost of the material. In this regard, use of base metal materials, such as relatively inexpensive copper and the like, has been suggested recently.

For example, Japanese Unexamined Patent Application Publication No. 2002-255644 discloses a multilayer piezoelectric device including layers of a PZT (lead zirconate titanate, Pb(Ti, Zr) $O_3$) piezoelectric ceramic and layers of internal electrode stacked in an alternating manner.

Japanese Unexamined Patent Application Publication No. 2002-261343 discloses an electromechanical transducer including a PZT piezoelectric ceramic integrated with internal electrodes by firing, in which the internal electrodes are mainly composed of a base metal material, such as copper or a copper alloy, having a rigidity of 160 GPa or less.

PCT Japanese Translation Patent Publication No. 2003-529917 discloses a piezoelectric structural device including a PZT piezoelectric ceramic and electrodes containing copper. A piezoelectric structural device in which the B sites of the PZT piezoelectric ceramic are partly substituted with divalent metal cations acting as acceptors or pentavalent metal cations acting as donors is also disclosed.

The piezoelectric device used as the piezoelectric actuator described above is used as a mechanical driving source and thus is required to have a large displacement. In order to achieve a large displacement within a limited device size, the piezoelectric constant d must be large.

SUMMARY OF THE INVENTION

The present inventors have conducted investigations and discovered that when a base metal material such as copper is used as the internal electrode material and fired, copper that is supposed to form the internal electrodes is oxidized to a certain extent and diffuses into the piezoelectric ceramic during firing even in a reducing atmosphere, thereby resulting in degradation of piezoelectric characteristics such as piezoelectric constant.

In other words, the inventors have discovered that when a base metal material, such as copper, is used as the internal electrode material, copper is oxidized during firing and it is difficult to achieve a piezoelectric characteristic comparable to when Ag—Pd having high oxidation resistance is used as in the related art.

However, the compositions of the existing PZT piezoelectric ceramics disclosed in the prior art documents described above do not take into account such degradation in characteristics caused by diffusion of the internal electrode material into the piezoelectric ceramic. Thus, it has been difficult to form a piezoelectric device having desired piezoelectric characteristics.

In order to overcome the problems described above, preferred embodiments of the present invention a piezoelectric device that achieves satisfactory piezoelectric characteristics even when a base metal material containing inexpensive copper as a main component is used as an electrode material.

The present inventors have ardently conducted investigations to achieve the above-described advantages and discovered that a piezoelectric device having a desirably high piezoelectric constant d and a high Curie temperature Tc can be obtained by simultaneously firing electrodes mainly composed of copper and a piezoelectric ceramic when the blend molar ratio of the components of a PZT piezoelectric ceramic containing an acceptor element and a donor element as third components is adjusted such that the donor content is excessive compared to a stoichiometric composition.

Preferred embodiments of the present invention have developed on the basis of such findings and discoveries. A piezoelectric device according to a preferred embodiment of the present invention is formed by simultaneously firing a piezoelectric ceramic mainly composed of a perovskite complex oxide represented by general formula $ABO_3$ and electrodes mainly composed of copper. The perovskite complex oxide contains lead in the A sites, and titanium, zirconium, an acceptor element $M^{II}$ which is a divalent metal element, and a donor element $M^V$ which is a pentavalent metal element in the B sites; and equations $0.05 \leq z \leq 0.40$, $0 < bz/3 \leq 0.035$, and $0.345 \leq x \leq 0.480$ are satisfied wherein z is the total molar content of the acceptor element $M^{II}$ and the donor element $M^V$ in the B sites, the blend molar ratio of the acceptor element $M^{II}$ to the donor element $M^V$ is 1:(2+b), and x is the molar content of titanium in the B sites.

The average valence of the B sites in the perovskite complex oxide represented by general formula $ABO_3$ is 4 in a stoichiometric composition. Thus, when the B-site elements, such as Ti and Zr, are partly substituted with a divalent metal element (acceptor element $M^{II}$) acting as an acceptor and a pentavalent metal element (donor element $M^V$) acting as a donor, the blend molar ratio of the acceptor element $M^{II}$ to the donor element $M^V$ becomes 1:2 in the stoichiometric composition.

In the case where copper is used as the internal electrode material and fired simultaneously with the piezoelectric ceramic in a reducing atmosphere, copper, which is readily oxidizable, forms copper oxide and diffuses into the piezoelectric ceramic.

Once copper oxide diffuses into the piezoelectric ceramic, copper dissolves in the B site thereby functioning as an acceptor and decreasing the average valence since the valence of copper is 2 whereas the average valence of the B sites is 4.

In preferred embodiments of the present invention, the average valence of the B sites preferably is adjusted in advance to be larger than 4 so that the donor is in excess. In this manner, even when copper in the electrodes diffuses into the piezoelectric ceramic and dissolves in the B sites, the decrease in average valence due to the copper diffusion can be compensated and the decrease in piezoelectric constant d can be suppressed.

The acceptor element $M^{II}$ preferably contains at least one element selected from the group consisting of nickel, zinc, manganese, cobalt, iron, chromium, and copper.

The donor element $M^V$ preferably contains at least one element selected from the group consisting of niobium, antimony, tantalum, and vanadium.

The electrodes preferably are internal electrodes, and the piezoelectric device preferably has a multilayer structure in which the internal electrodes and layers of the piezoelectric ceramic are alternately stacked.

The present inventors have conducted further investigations and discovered that a piezoelectric device having a desirably high piezoelectric constant d and a high Curie temperature Tc can be obtained by making the A-site/B-site blend molar ratio deviate from the stoichiometric or by partly substituting lead, which is the main component of the A sites, with an appropriate metal element, if required.

In other words, the piezoelectric device according to a preferred embodiment of the present invention is characterized in that the piezoelectric ceramic is represented by compositional formula, $Pb_{\alpha-a}Me_a[(M^{II}_{1/3}M^V_{(2+b)/3})_z Ti_x Zr_{1-x-z}]O_3$ (wherein Me represents a metal element), and $\alpha$ and a respectively satisfy equations $0.965 \leq \alpha \leq 1.020$ and $0 \leq a \leq 0.05$.

The metal element Me preferably contains at least one element selected from the group consisting of barium, strontium, calcium, scandium, yttrium, lanthanum, neodymium, and bismuth.

The present inventors have conducted further studies and discovered that incorporation of nickel in the electrodes increases the piezoelectric constant d, and this effect is particularly notable when the nickel content in the total metal content is about 10 wt % or more.

Thus, it is preferable that the electrodes contain nickel.

The electrodes preferably are formed by sintering a conductive paste in which the copper content in the metal component is about 70 wt % or more and about 90 wt % or less and the nickel content in the metal component is about 10 wt % or more and about 30 wt % or less (wherein the total content of copper and nickel is about 100 wt % or less).

The present inventors have observed a piezoelectric device including electrodes that has a nickel content of about 10 wt % or more in the metal component by taking a cross-section near the electrodes. It has been discovered that a copper phase is formed in the internal electrodes and NiO is present in one or both of the interface between the copper phase and the piezoelectric ceramic and a pore formed in the copper phase. It is considered that this state contributes to increasing the piezoelectric constant d.

In other words, it is preferred that, in the electrodes, a copper phase substantially composed of copper is formed and NiO is present in one or both of the interface between the copper phase and the piezoelectric ceramic and a pore formed in the copper phase.

In the case where nickel is contained in the electrodes, the acceptor element $M^{II}$ preferably at least contains nickel.

The piezoelectric device according to various preferred embodiments of the present invention is formed by simultaneously firing a piezoelectric ceramic mainly composed of a perovskite complex oxide represented by general formula $ABO_3$ and electrodes mainly composed of copper. The perovskite complex oxide contains lead in the A sites, and titanium, zirconium, an acceptor element $M^{II}$ comprising a divalent metal element, and a donor element $M^V$ comprising a pentavalent metal element in the B sites; and equations $0.05 \leq z \leq 0.40$, $0 < bz/3 \leq 0.035$, and $0.345 \leq x \leq 0.480$ are satisfied wherein z is the total molar content of the acceptor element $M^{II}$ (e.g., nickel, zinc, manganese, or the like) and the donor element $M^V$ (niobium, antimony, tantalum, or the like) in the B sites, the blend molar ratio of the acceptor element $M^{II}$ to the donor element $M^V$ is 1:(2+b), and x is the molar content of titanium in the B sites. Accordingly, the B sites contain a donor in an amount larger than the stoichiometric, and charges will be compensated even when copper, which is the main component of the electrodes, diffuses into the piezoelectric ceramic during firing. As a result, a piezoelectric device having satisfactory piezoelectric characteristics, such as a high piezoelectric constant d and a high Curie temperature Tc, can be obtained.

In particular, piezoelectric devices having excellent piezoelectric characteristics, such as a piezoelectric constant $d_{33}$ of about 550 pm/V or more at an electrical intensity of about 2 kV/mm and a Curie temperature Tc of about 180° C. or more, suitable for injection valves of automobile engines, alignment of precision instruments, print heads of inkjet printers, and the like, can be realized.

It is preferred that the electrodes are internal electrodes, and the device has a multilayer structure in which the internal electrodes and layers of the piezoelectric ceramic are alternately stacked. Thus, a piezoelectric device having a large displacement can be obtained within the limited device size.

Moreover, the piezoelectric ceramic is represented by compositional formula, $Pb_{\alpha-a}Me_a[(M^{II}_{1/3}M^V_{(2+b)/3})_z Ti_x Zr_{1-x-z}]O_3$ (wherein Me represents a metal element such as barium, strontium, calcium, or the like), and $\alpha$ and a respectively satisfy equations $0.965 \leq \alpha \leq 1.020$ and $0 \leq a \leq 0.05$. Thus, a piezoelectric device having a desirably high piezoelectric constant d and a high Curie temperature Tc can be obtained by making the A-site/B-site blend molar ratio deviate from the stoichiometric or by partly substituting lead, which is the main component of the A sites, with an appropriate metal element, if required. It thereby becomes possible to obtain a desired piezoelectric device suitable for usage.

Since the electrodes of the piezoelectric device according to various preferred embodiments of the present invention contain nickel, a higher piezoelectric constant can be achieved. This is presumably because nickel, which is more easily oxidizable than copper, exists in the electrodes and suppresses oxidation of copper and diffusion of copper into the piezoelectric ceramic during firing.

The electrodes preferably are formed by sintering a conductive paste that has a copper content of about 70 wt % or more and about 90 wt % or less in the metal component and a nickel content of about 10 wt % or more and about 30 wt % or less in the metal component (wherein the total content of copper and nickel is about 100 wt % or less). Thus, the piezoelectric constant d can be notably improved.

In the electrodes, a copper phase substantially composed of copper is formed and NiO is present in one or both of the interface between the copper phase and the piezoelectric ceramic and a pore formed in the copper phase. Thus, a piezoelectric device having a high piezoelectric constant can be obtained. This is presumably due to the presence of the NiO phase that suppresses diffusion of CuO, which is formed by oxidation during firing, into the piezoelectric ceramic.

In the case where nickel is contained in the electrodes, the acceptor element $M^{II}$ should at least contain nickel so that diffusion of nickel in the electrode into the piezoelectric ceramic can be suppressed and the decrease in piezoelectric characteristics can be effectively suppressed. Moreover, as described above, since the donor in the B sites is excessive and nickel diffusing from the electrodes acts as an acceptor once it is dissolved in the B sites, the decrease in average valence of the B sites resulting from diffusion of nickel from the electrodes can be compensated.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described in detail.

Figure 1:
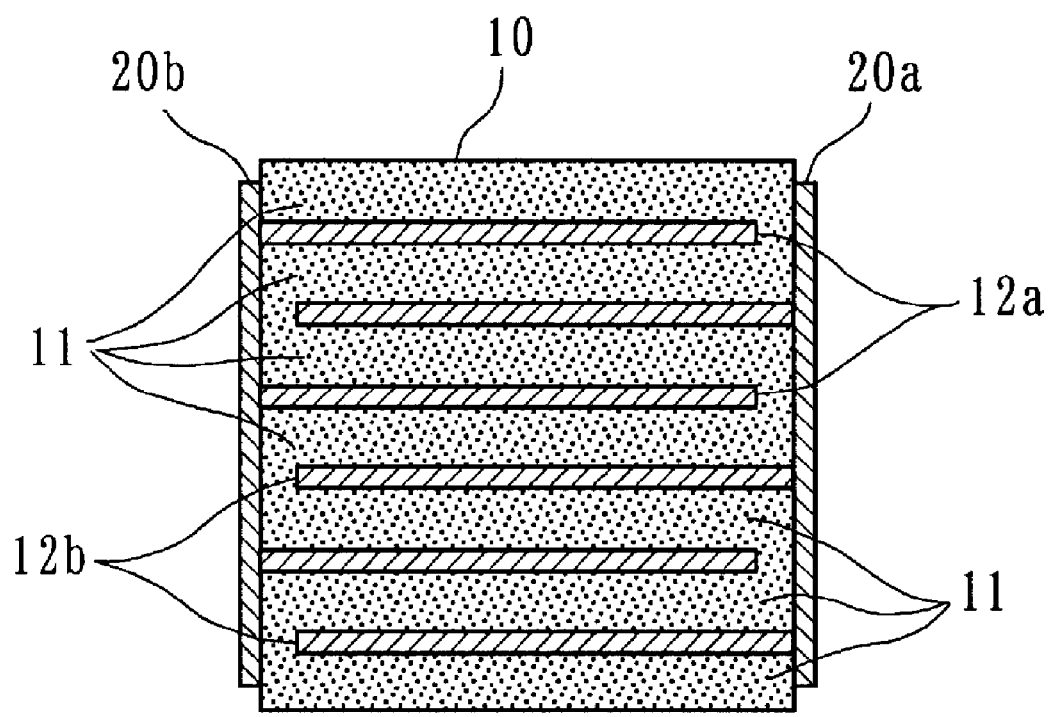
FIG. 1 is a cross-sectional view showing a piezoelectric device according to a preferred embodiment of the present invention.

FIG. 1 is a cross-sectional view showing a piezoelectric device according a preferred embodiment of the present invention.

In this piezoelectric device, internal electrodes $12a$ and $12b$ mainly composed of copper are disposed inside a multilayered sinter 10, and external electrodes $20a$ and $20b$ are respectively provided on the two side surfaces of the multilayered sinter 10.

The multilayered sinter 10 has a multilayer structure in which the internal electrodes $12a$ and $12b$ and layers of a piezoelectric ceramic 11 are alternately stacked. The internal electrodes $12a$ are extended to one of the side surfaces so as to be electrically connected to the external electrode $20b$. The internal electrodes $12b$ are extended to the other side surface so as to be electrically connected to the external electrode $20a$. The internal electrodes $12a$ and $12b$ and the piezoelectric ceramic 11 are fired simultaneously during a firing step of the production process and thereby form the multilayered sinter 10.

In this preferred embodiment, the piezoelectric ceramic 11 is composed of a perovskite complex oxide represented by compositional formula (I):

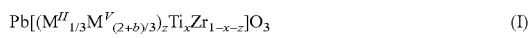

$$Pb[(M^{II}_{1/3}M^{V}_{(2+b)/3})_z Ti_x Zr_{1-x-z}]O_3 \qquad (I)$$

where $M^{II}$ is an acceptor element which is a divalent metal element and $M^{V}$ is a donor element which is a pentavalent metal element.

In other words, the material represented by formula (I) is a perovskite complex oxide represented by general formula $ABO_3$, in which lead is dissolved in the A sites and titanium, zirconium, and a third component ($M^{II}$, $M^{V}$) are dissolved in the B sites.

The acceptor element $M^{II}$ may be any divalent metal element that can act as an acceptor for tetravalent titanium or zirconium. Preferable examples thereof include, but are not limited to, nickel, zinc, cobalt, manganese, iron, chromium, and copper.

The donor element $M^{V}$ may be any pentavalent metal element that can act as a donor for tetravalent titanium or zirconium. Preferable examples thereof include, but are not limited to, niobium, antimony, tantalum, and vanadium.

The compositional components are blended so that z, b, and x satisfy equations (1) to (3):

$$0.05 \leq z \leq 0.40 \qquad (1)$$

$$0 < bz/3 \leq 0.035 \qquad (2)$$

$$0.345 \leq x \leq 0.480 \qquad (3)$$

The reasons for limiting z, bz/3, and x to the ranges described in equations (1) to (3) above are described in detail below.

(1) z z represents the molar content of the third component ($M^{II}$, $M^{V}$) in the B sites. If z exceeds about 0.40, the Curie temperature Tc will decrease and the critical temperature at which the piezoelectricity is lost will decrease, which is not desirable. In other words, a complex oxide of a third component ($M^{II}$, $M^{V}$) and lead has a Curie temperature Tc lower than that of normal PZT. In particular, when the third component ($M^{II}$, $M^{V}$) is excessively contained such as when z is more than about 0.40, the Curie temperature Tc will decrease and this is nor preferable.

On the other hand, the Curie temperature Tc can be increased by decreasing z. However, at z less than about 0.05, the piezoelectric constant may decrease.

In view of the above, in this preferred embodiment, the molar content of the third component ($M^{II}$, $M^{V}$) in the B sites is preferably adjusted to satisfy $0.05 \leq z \leq 0.40$.

(2) bz/3 bz/3 defines the content of the donor element $M^{V}$ in the B sites. At bz/3 equal to or less than 0, the molar content of the third component ($M^{II}$, $M^{V}$) renders the composition to become stoichiometric or to contain excessive acceptors, thereby possibly resulting in lowering of the piezoelectric constant d. That is, when the electrodes mainly composed of copper and the piezoelectric ceramic are simultaneously fired, a portion of copper that is supposed to form the electrodes is oxidized during firing into CuO, and diffuses into the piezoelectric ceramic 11. Whereas the average valence of the B sites is 4 in a stoichiometric composition, the valence of copper is 2. Thus, once CuO diffuses into the piezoelectric ceramic 11 and becomes dissolved in the B sites of the perovskite complex oxide, it acts as an acceptor. In such a case, if the bz/3 is 0 or a negative value and the molar content of the third component ($M^{II}$, $M^{V}$) renders the composition to be stoichiometric or to contain excessive acceptors, the valence of the B sites notably decreases from 4 and the piezoelectric constant d decreases. Moreover, a portion of CuO that does not diffuse into the piezoelectric ceramic 11 or is not dissolved in the perovskite complex oxide segregates in the crystal grain boundaries and forms segregation phases, which may decrease the piezoelectric constant d.

In contrast, bz/3 is set to a positive value so that the average valence of the B sites is larger than that of the stoichiometric composition (=4.000), i.e., so that the composition contains excess donors. In this manner, even in the case where copper diffuses into the piezoelectric ceramic 11 and dissolves in the B sites of the perovskite complex oxide to act as the acceptor element, the decrease in average valence resulting from copper diffusion can be compensated and the decrease in piezoelectric constant d can be suppressed thereby.

If bz/3 exceeds about 0.035, the sinterability of the piezoelectric ceramic 11 is degraded and the temperature required for firing is elevated. Thus, it becomes difficult to simultaneously fire the ceramic and the internal electrodes 12a and 12b mainly composed of copper. In particular, in order to obtain a piezoelectric ceramic 11 by simultaneously firing the ceramic and the internal electrodes 12a and 12b mainly composed of copper, the firing temperature must be about 1,000° C. or less. However, if bz/3 exceeds about 0.035, a firing temperature exceeding about 1,000° C. is required, and it becomes difficult to simultaneously fire the ceramic and the internal electrodes 12a and 12b.

In this preferred embodiment, bz/3 defining the donor element $M^V$ content in the B sites is thus preferably set to $0<bz/3\leq 0.035$.

(3) x

A PZT piezoelectric ceramic exhibits a high piezoelectric constant d when the solid solution composition is near the morphotropic phase boundary (MPB). In this preferred embodiment, as shown in equation (1) above, the molar content z of the third component ($M^H$, $M^V$) in the B sites preferably is limited to $0.05\leq z\leq 0.40$. Thus, when the titanium molar content x in the B sites is less than about 0.345 or more than about 0.480, the solid solution composition excessively deviates from the MPB, thereby resulting in lowering of the piezoelectric constant d.

Thus, in this preferred embodiment, the titanium molar content x in the B sites preferably is limited to $0.345\leq x\leq 0.480$.

As discussed above, in this preferred embodiment, since the piezoelectric ceramic 11 represented by formula (I) above preferably satisfies equations (1) to (3), the donor content in the B sites exceeds that of the stoichiometric composition. Accordingly, a piezoelectric device can be obtained in which the piezoelectric ceramic 11 and the internal electrodes 12a and 12b can be fired simultaneously and degradation of the piezoelectric characteristics resulting from diffusion of copper can be suppressed even when the internal electrodes 12a and 12b are mainly composed of copper.

The external electrodes 20a and 20b are preferably formed by applying a conductive paste on the both side surfaces of the sintered piezoelectric ceramic 11 and baking the applied paste. Examples of the electrode material that mainly constitutes the external electrodes 20a and 20b include, but are not limited to, silver, silver-platinum alloys, and copper.

In formula (I), the A sites are occupied by lead, and the A site/B site molar blend ratio is stoichiometric. Alternatively, if needed, the A site/B site molar blend ratio may be deviated from the stoichiometric ratio or part of lead occupying the A sites may be substituted with a metal element.

In such a case, the piezoelectric ceramic 11 is represented by compositional formula (II) below:

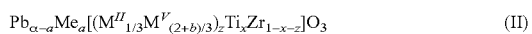

$$Pb_{\alpha-a}Me_a[(M^H_{1/3}M^V_{(2+b)/3})_z Ti_x Zr_{1-x-z}]O_3 \quad (II)$$

In the formula, Me is preferably an alkaline earth metal such as calcium, barium, or strontium; a rare earth metal such as scandium, yttrium, lanthanum, or neodymium; or bismuth.

When the piezoelectric ceramic 11 is represented by formula (II), α and a must satisfy equations (4) and (5) below:

$$0.965 \leq \alpha \leq 1.020 \quad (4)$$

$$0 \leq a \leq 0.05 \quad (5)$$

The reasons for limiting α and a to equations (4) and (5) are described below.

(4) α

α defines the A site/B site molar blend ratio. At α less than about 0.965, the composition excessively deviates from the stoichiometric, resulting in lowering of the sinterability, and the composition cannot be sintered at a firing temperature of about 1,000° C. Thus, it becomes difficult to simultaneously fire the ceramic and the internal electrodes 12a and 12b mainly composed of copper.

If α exceeds about 1.020, the molar ratio of the A site is excessively large, and the A-site component segregates in the crystal boundaries, thereby possibly lowering the piezoelectric constant.

Thus, in the case where the A site/B site molar blend ratio is deviated from the stoichiometric ratio, the molar blend ratio α is preferably about $0.965 \leq \alpha \leq 1.020$.

(5) a a defines the substitution molar ratio of the A sites. If a exceeds about 0.05, the sinterability is decreased, and the piezoelectric ceramic cannot be sintered at a firing temperature of about 1,000° C. Thus, the ceramic and the internal electrodes 12a and 12b cannot be fired simultaneously.

Therefore, the substitution molar ratio a in the A sites is preferably about $0 \leq a \leq 0.05$.

The piezoelectric constant d increases with the substitution molar ratio a, but the Curie temperature Tc decreases with the increasing substitution molar ratio a. Thus, it is preferable to adequately set the substitution molar ratio a in the range of $0 \leq a \leq 0.05$ so that the desired piezoelectric constant and Curie temperature Tc can be obtained depending on the type of the substituent element Me.

In the piezoelectric device described above, the internal electrodes are mainly composed of copper. Nickel is preferably contained as another component. A piezoelectric device exhibiting a large piezoelectric constant $d_{33}$ can be obtained by incorporation of nickel.

The mechanism for this is not clear. It is presumed that when nickel, which is more easily oxidizable than copper and has a higher equilibrium oxygen partial pressure in the redox reaction than copper, is contained, oxidation of copper during firing is suppressed and diffusion of CuO into the piezoelectric ceramic 11 is suppressed.

In other words, in general, when the internal electrodes 12a and 12b mainly composed of copper and the piezoelectric ceramic 11 are fired simultaneously, firing is performed under an oxygen partial pressure such that the constituent elements, such as lead, zirconium, titanium, and the like, of the piezoelectric ceramic 11 are oxidized but the electrode material, such as copper, remains unoxidized. However, since the difference in equilibrium oxygen partial pressure of the redox reaction is small between lead and copper, copper inevitably becomes oxidized to a certain extent.

However, it is presumed that when nickel is contained in advance in the conductive paste for forming the internal electrodes, nickel more easily oxidizable than copper is oxidized first, thereby suppressing oxidation of copper, and degradation of the characteristics of the piezoelectric device resulting from the diffusion of CuO into the piezoelectric ceramic is suppressed as a result.

In the case where nickel is contained in the internal electrodes 12a and 12b, nickel is preferably used as the acceptor element $M^H$. That is, in the case where nickel is contained in the internal electrodes 12a and 12b and a divalent metal element, such as zinc or manganese, other than nickel is used as the acceptor element $M^H$, NiO produced by oxidation of nickel diffuses into the piezoelectric ceramic 11, thereby possibly degrading the characteristics of the piezoelectric device. In contrast, in the case where nickel is contained in the internal electrodes 12a and 12b, and also nickel is in the piezoelectric ceramic 11 beforehand as the acceptor element $M^{II}$, the amount of nickel diffusing and dissolving into the piezoelectric ceramic 11 becomes limited, and diffusion of NiO into the piezoelectric ceramic 11 from the internal electrodes 12a and 12b can be suppressed.

In other words, in such a case, a copper phase mainly composed of copper is formed in the internal electrodes 12a and 12b, and NiO exists in the interface between the copper phase and the piezoelectric ceramic 11 and/or pores formed in the copper phase. In this manner, diffusion of CuO, produced by oxidation during firing, into the piezoelectric ceramic 11 can be further effectively suppressed, and the piezoelectric constant $d_{33}$ of the piezoelectric ceramic 11 can be further improved.

In the case where nickel is to be contained in the internal electrodes 12a and 12b, a conductive paste in which the copper content in the metal component is about 70 wt % or more and about 90 wt % or less and the nickel content in the metal component is about 10 wt % or more and about 30 wt % or less (wherein the total content of copper and nickel is about 100 wt % or less) is preferably used.

At a copper content exceeding 90 wt % and a nickel content less than about 10 wt %, the effect of improving the piezoelectric constant by incorporation of nickel in the internal electrodes is not sufficiently exhibited because the nickel content is excessively small. The cause for this is presumably that the effect of suppressing oxidation of copper is not sufficient if the nickel content is excessively small. In contrast, at a copper content less than about 70 wt % and a nickel content exceeding about 30 wt %, the nickel content becomes excessively large, and nearly all nickel is oxidized during firing. As a result, the metal component content in the internal electrodes 12a and 12b becomes excessively small and the covering ratio of the internal electrodes 12a and 12b is decreased, thereby possibly resulting in failure to achieve sufficient displacement.

Accordingly, in the case where nickel is contained in the conductive paste, the copper content in the metal component is about 70 wt % or more and about 90 wt % or less and the nickel content is about 10 wt % or more and about 30 wt % or less. Preferably, the copper content in the metal component is about 70 wt % or more and about 85 wt % or less and the nickel content is about 15 wt % or more and about 30 wt % or less (the total content of copper and nickel being about 100 wt % or less).

Figure 2:
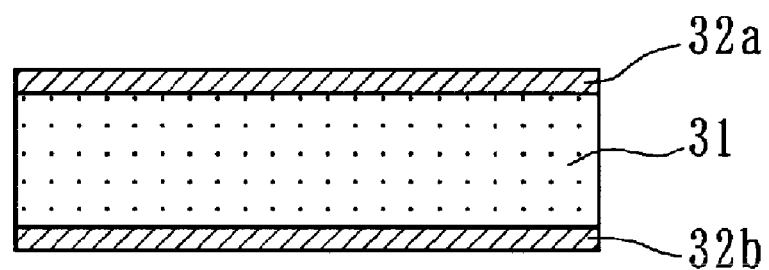
FIG. 2 is a cross-sectional view showing a piezoelectric device according to another preferred embodiment of the present invention.

The present invention is not limited to the preferred embodiment described above. Although a multilayer piezoelectric device having a multilayer structure is illustrated in the above-described preferred embodiment as an example of the piezoelectric device, the present invention is also applicable to a single-layer piezoelectric device having electrodes 32a and 32b respectively formed on two main surfaces of a piezoelectric ceramic 31 according to a preferred embodiment of the present invention, as shown in FIG. 2.

The present invention will now be described by way of specific examples.

EXAMPLE 1

Powders of $Pb_3O_4$, $TiO_2$, $ZrO_2$, NiO, and $Nb_2O_5$ were prepared as ceramic raw materials, and predetermined amounts of the ceramic raw materials were weighed and mixed so that compositions shown in Table 1 were obtained. Each mixture was wet-milled for 16 hours and calcined for 2 hours at 850° C. to obtain a calcined powder of a perovskite complex oxide represented by compositional formula (I):

$$Pb[(Ni_{1/3}Nb_{(2+b)/3})_zTi_xZr_{1-x-z}]O_3 \quad (I)$$

The resulting calcined powder was mixed with a binder and pure water to obtain a ceramic slurry, and ceramic green sheets having a thickness of 60 μm were prepared by a doctor blade method.

A conductive paste containing 85 wt % of a copper powder and 15 wt % of a nickel powder was prepared and applied on the ceramic green sheets by screen printing to form conductive layers having predetermined patterns.

The ceramic green sheets with the conductive layers thereon were stacked in a predetermined direction, and the resulting stack was sandwiched by ceramic green sheets with no conductive layers. The resulting stack was press-bonded with a press machine to form a green compact.

The green compact was heated at 500° C. to remove the binder and fired for 5 hours at 1,000° C. in a nitrogen atmosphere with an oxygen concentration of 1 ppm to 2 ppm to obtain a ceramic sinter.

The ceramic sinter was cut into a multilayer composite having a length of 7 mm, a width of 7 mm, and a thickness of 6 mm, and a conductive paste containing a silver powder was applied on two side surfaces of the ceramic body. The paste was baked at 780° C. into external electrodes, and the ceramic body with the external electrodes was subjected to polarization treatment under application of 3 kV/mm electrical field in oil at 80° C. Piezoelectric devices of Sample Nos. 1 to 35 were obtained as a result.

The number of internal electrode layers of each piezoelectric device was 80.

A triangular wave having a frequency of 0.1 Hz was applied to the piezoelectric devices of Sample Nos. 1 to 35 while varying the electric intensity from 0 to 2 kV/mm, and the amount of thickness strain was measured with an inductive probe and a differential transformer. The observed value of thickness strain was divided by the electric intensity to determine the piezoelectric constant $d_{33}$.

The capacitance of the piezoelectric devices of Sample Nos. 1 to 35 was measured with an impedance analyzer while varying the temperature, and the temperature at which the maximum capacitance was observed was assumed to be the Curie temperature Tc.

Table 1 shows the compositions, the piezoelectric constant $d_{33}$, and the Curie temperature Tc of Sample Nos. 1 to 35.

TABLE 1

| Sample No. | $Pb(Ni_{1/3}Nb_{(2+b)/3})_zTi_xZr_{1-x-z}O_3$ | | | | Piezoelectric constant $d_{33}$ (pm/V) | Curie temperature Tc (° C.) |
|---|---|---|---|---|---|---|
| | b | z | bz/3 | x | | |
| 1* | 0.067 | 0.45 | 0.010 | 0.3475 | 805 | 170 |
| 2 | 0.075 | 0.40 | 0.010 | 0.3600 | 820 | 180 |
| 3 | 0.100 | 0.30 | 0.010 | 0.3925 | 815 | 240 |
| 4 | 0.150 | 0.20 | 0.010 | 0.4225 | 790 | 280 |
| 5 | 0.300 | 0.10 | 0.010 | 0.4500 | 670 | 320 |
| 6 | 0.600 | 0.05 | 0.010 | 0.4650 | 635 | 340 |
| 7* | 1.000 | 0.03 | 0.010 | 0.4650 | 495 | 345 |
| 8* | 0.600 | 0.20 | 0.040 | 0.4225 | — | — |
| 9 | 0.525 | 0.20 | 0.035 | 0.4225 | 675 | 275 |
| 10 | 0.300 | 0.20 | 0.020 | 0.4225 | 720 | 280 |
| 11 | 0.075 | 0.20 | 0.005 | 0.4225 | 785 | 280 |
| 12 | 0.030 | 0.20 | 0.002 | 0.4225 | 700 | 280 |
| 13* | 0.000 | 0.20 | 0.000 | 0.4225 | 535 | 280 |
| 14* | 0.300 | 0.40 | 0.040 | 0.3600 | — | — |
| 15 | 0.263 | 0.40 | 0.035 | 0.3600 | 705 | 180 |
| 16 | 0.150 | 0.40 | 0.020 | 0.3600 | 800 | 180 |
| 17 | 0.038 | 0.40 | 0.005 | 0.3600 | 805 | 180 |
| 18 | 0.015 | 0.40 | 0.002 | 0.3600 | 655 | 180 |
| 19* | 0.000 | 0.40 | 0.000 | 0.3600 | 515 | 180 |
| 20* | 2.400 | 0.05 | 0.040 | 0.4650 | — | — |
| 21 | 2.100 | 0.05 | 0.035 | 0.4650 | 625 | 340 |
| 22 | 1.200 | 0.05 | 0.020 | 0.4650 | 630 | 340 |

TABLE 1-continued

| Sample No. | Pb(Ni$_{1/3}$Nb$_{(2+b)/3}$)$_z$Ti$_x$Zr$_{1-x-z}$O$_3$ | | | Piezoelectric constant d$_{33}$ (pm/V) | Curie temperature Tc (° C.) |
|---|---|---|---|---|---|
| | b | z | bz/3 | x | | |
| 23 | 0.300 | 0.05 | 0.005 | 0.4650 | 655 | 340 |
| 24 | 0.120 | 0.05 | 0.002 | 0.4650 | 590 | 340 |
| 25* | 0.000 | 0.05 | 0.000 | 0.4650 | 460 | 340 |
| 26* | 0.133 | 0.45 | 0.020 | 0.3475 | 800 | 165 |
| 27* | 0.233 | 0.45 | 0.035 | 0.3475 | 695 | 165 |
| 28* | 2.000 | 0.03 | 0.020 | 0.4675 | 510 | 350 |
| 29* | 2.000 | 0.03 | 0.020 | 0.4675 | 440 | 350 |
| 30* | 0.600 | 0.05 | 0.010 | 0.4850 | 515 | 340 |
| 31 | 0.600 | 0.05 | 0.010 | 0.4800 | 580 | 340 |
| 32 | 0.600 | 0.05 | 0.010 | 0.4600 | 605 | 340 |
| 33 | 0.075 | 0.40 | 0.010 | 0.3650 | 795 | 190 |
| 34 | 0.075 | 0.40 | 0.010 | 0.3450 | 600 | 180 |
| 35* | 0.075 | 0.40 | 0.010 | 0.3400 | 505 | 180 |

Asterisked samples are outside the range of the present invention.

It was found that, in Sample Nos. 1, 26, and 27, z was 0.45, which was more than 0.40, and the piezoelectric constant d$_{33}$ was thus as high as 695 to 805 pm/V. However, the Curie temperature Tc was 165° C. to 170° C., i.e., not more than 170° C.

It was found that, in Sample Nos. 7, 28, and 29, z was 0.03, which was less than 0.05 and the Curie temperature Tc was thus as high as in the range of 345° C. to 350° C. However, the piezoelectric constant d$_{33}$ was 440 to 510 pm/V, which was not more than 510 pm/V.

In Sample Nos. 8, 14, and 20, bz/3 was 0.040 and exceeds 0.035. This caused degradation of sinterability, and the internal electrodes and the piezoelectric ceramic could not be simultaneously sintered and the desired sinter could not be obtained under the above-described firing conditions (firing temperature: 1,000° C., a nitrogen atmosphere).

In Sample Nos. 13, 19, and 25, bz/3 was 0, and the piezoelectric constant d$_{33}$ was as low as 460 to 535 pm/V. This is presumably because the third component (Ni, Nb) was dissolved in the B sites in a stoichiometric composition and this caused diffusion of Cu and/or Ni, i.e., the internal electrode material, into the piezoelectric ceramic during firing.

In Sample No. 30, x was 0.4850, which was more than 0.480. Thus, the piezoelectric constant d$_{33}$ decreased to 515 pm/V. In Sample No. 35, x was 0.3400, which was less than 0.345. Thus, the piezoelectric constant d$_{33}$ was as low as 505 pm/V. In other words, it was confirmed from Sample Nos. 30 and 35 that since the solid solution composition deviated from the MPB, the piezoelectric constant d$_{33}$ was low.

In contrast, in Sample Nos. 2 to 6, 9 to 12, 15 to 18, 21 to 24, and 31 to 34, z, bz/3, and x all satisfied the ranges of preferred embodiments of the present invention, i.e., $0.05 \leq z \leq 0.40$, $0 < bz/3 \leq 0.035$, and $0.345 \leq x \leq 0.480$, and therefore their piezoelectric constants d$_{33}$ were 550 pm/V or more and their Curie temperatures were 180° C. or more.

EXAMPLE 2

Ceramic raw materials the same as those in Example 1 were used. Predetermined amounts of raw materials were weighed and mixed to prepare compositions shown in Table 2. Each mixture was wet-milled for 16 hours and calcined at 850° C. for 2 hours to obtain a calcined powder composed a perovskite complex oxide represented by formula (IIa):

$$Pb[(Ni_{1/3}Nb_{(2+b)/3})_zTi_xZr_{1-x-z}]O_3 \quad (IIa)$$

In other words, the blend molar ratio α of lead, which is the A-site component, to the B sites was varied, and calcined powders of Sample Nos. 41 to 47 were obtained.

Piezoelectric devices of Sample Nos. 41 to 47 were then made by the same method and procedure as in Example 1, and the piezoelectric constant d$_{33}$ and the Curie temperature Tc were measured.

Table 2 shows the compositions, the piezoelectric constants d$_{33}$, and the Curie temperatures Tc of Sample Nos. 41 to 47.

TABLE 2

| Sample No. | Pb$_α$(Ni$_{1/3}$Nb$_{(2+b)/3}$)$_z$Ti$_x$Zr$_{1-x-z}$O$_3$ | | | | | Piezoelectric constant d$_{33}$ (pm/V) | Curie temperature Tc (°c) |
|---|---|---|---|---|---|---|---|
| | α | b | z | bz/3 | x | | |
| 41** | 1.030 | 0.150 | 0.20 | 0.010 | 0.4225 | 410 | 280 |
| 42 | 1.020 | 0.150 | 0.20 | 0.010 | 0.4225 | 660 | 280 |
| 43 | 1.000 | 0.150 | 0.20 | 0.010 | 0.4225 | 790 | 280 |
| 44 | 0.990 | 0.150 | 0.20 | 0.010 | 0.4225 | 715 | 280 |
| 45 | 0.970 | 0.150 | 0.20 | 0.010 | 0.4225 | 615 | 280 |
| 46 | 0.965 | 0.150 | 0.20 | 0.010 | 0.4225 | 590 | 280 |
| 47** | 0.960 | 0.150 | 0.20 | 0.010 | 0.4225 | — | — |

Double-asterisked samples are outside the range of the present invention (claim 3).

In Sample No. 41, α was 1.030, which was over 1.020, and the piezoelectric constant d$_{33}$ thus decreased to 410 pm/V.

In Sample No. 47, α was 0.960, which was less than 0.965. Thus, the sinterability was degraded, and the internal electrodes and the piezoelectric ceramic could not be fired simultaneously under the above-described firing conditions (firing temperature: 1,000° C., under a nitrogen atmosphere). A desired sinter could not be obtained.

In contrast, α in Sample Nos. 42 to 46 was $0.965 \leq α \leq 1.020$, and z, bz/3, and x all satisfied the ranges of preferred embodiments of the present invention, i.e., $0.05 \leq z \leq 0.40$, $0 < bz/3 \leq 0.035$, and $0.345 \leq x \leq 0.480$. Their piezoelectric constants d$_{33}$ were 590 to 790 pm/V and their Curie temperatures were as high as 280° C. Thus, it was found

13 that piezoelectric devices having satisfactory piezoelectric characteristics could be obtained.

EXAMPLE 3

The ceramic raw materials described in Example 1, $BaCO_3$, $SrCO_3$, $CaCO_3$, $Nd_2O_3$, and $Bi_2O_3$ were prepared, and predetermined amounts of these raw materials were weighed and mixed to obtain compositions shown in Table 3. Each resulting mixture was wet-milled for 16 hours and calcined at 850° C. for 2 hours to obtain calcined powders composed of perovskite complex oxide represented by formula (IIb):

$$Pb_{1.000-a}Me_a[(Ni_{1/3}Nb_{2.150/3})_{0.2}Ti_{0.4225}Zr_{0.3775}]O_3 \quad (IIb)$$

In other words, α was set to 1.000, z was set to 0.2, bz/3 was set to 0.010, x was set to 0.4225, and part of lead in the A sites was substituted with a metal element Me to obtain calcined powders of Sample Nos. 51 to 58.

Piezoelectric devices of Sample Nos. 51 to 58 were then made by the same method and procedure as in Example 1. Their piezoelectric constants $d_{33}$ and Curie temperatures Tc were measured.

Table 3 shows the compositions, the piezoelectric constants $d_{33}$, and the Curie temperatures Tc of Sample Nos. 51 to 58.

14 which were within the ranges of preferred embodiments of the present invention. Thus, the piezoelectric constants $d_{33}$ were as high as 800 to 805 pm/V, and the Curie temperatures were as high as 240° C. to 270° C. It was found that desired sinters could be obtained.

Sample Nos. 54 to 58 clearly showed that a piezoelectric device having a high piezoelectric constant $d_{33}$ and a high Curie temperature Tc could be obtained by substituting part of lead with strontium, calcium, lanthanum, neodymium, or bismuth instead of barium.

EXAMPLE 4

The ceramic raw materials described in Example 1, ZnO, MnO, $Sb_2O_5$, and $Ta_2O_5$ were prepared. Predetermined amounts of these ceramic raw materials were weighed and mixed to prepare compositions shown in Table 4. Each resulting mixture was wet-milled for 16 hours and calcined at 850° C. for 2 hours to obtain a calcined powder composed of a perovskite complex oxide represented by formula (IIc):

$$Pb_\alpha[(M^{II}_{1/3}M^V_{2.150/3})_{0.2}Ti_xZr_{0.8-x}]O_3 \quad (IIc)$$

In other words, z was set to 0.2, bz/3 was set to 0.010, and the acceptor element $M^{II}$ and the donor element $M^V$ were varied to obtain calcined powders of Sample Nos. 61 to 65.

TABLE 3

| Sample No. | $Pb_{1.000-a}Me_a(Ni_{1/3}Nb_{2.150/3})_{0.2}Ti_{0.4225}Zr_{0.3775}O_3$ | | Piezoelectric constant $d_{33}$ (pm/V) | Curie temperature Tc (° C.) |
|---|---|---|---|---|
| | Me | a | | |
| 51 | Ba | 0.025 | 805 | 270 |
| 52 | Ba | 0.050 | 800 | 240 |
| 53** | Ba | 0.075 | — | — |
| 54 | Sr | 0.025 | 765 | 260 |
| 55 | Ca | 0.025 | 720 | 260 |
| 56 | La | 0.025 | 725 | 250 |
| 57 | Nd | 0.025 | 725 | 250 |
| 58 | Bi | 0.025 | 740 | 270 |

Double-asterisked sample is outside the range of the present invention (claim 3).

In Sample No. 53, a was 0.075, which was over 0.05. Thus, the sinterability was degraded, the internal electrodes and the piezoelectric ceramic could not be fired simultaneously under the above-described firing conditions (firing temperature: 1,000° C., a nitrogen atmosphere), and the desired sinter could not be obtained.

In contrast, in Sample Nos. 51 and 52, a was 0.05 or less, α was 1.000, z was 0.2, bz/3 was 0.010, and x was 0.4225, Piezoelectric devices of Sample Nos. 61 to 65 were then made by the same method and procedure as in Example 1, and the piezoelectric constant $d_{33}$ and the Curie temperature Tc were measured.

Table 4 shows the compositions, the piezoelectric constants $d_{33}$, and the Curie temperatures Tc of Sample Nos. 61 to 65.

TABLE 4

| Sample No. | $Pb_\alpha(M^{II}_{1/3}M^V_{2.150/3})_{0.2}Ti_xZr_{0.8-x}O_3$ | | | | Piezoelectric constant $d_{33}$ (pm/V) | Curie temperature Tc (° C.) |
|---|---|---|---|---|---|---|
| | $M^{II}$ | $M^V$ | α | x | | |
| 61 | Zn | Nb | 0.995 | 0.4075 | 680 | 310 |
| 62 | Ni | Sb | 1.000 | 0.4225 | 710 | 270 |
| 63 | Ni/Mn = 9/1 | Nb | 0.998 | 0.4175 | 705 | 275 |
| 64 | Ni/Zn = 1/1 | Nb | 0.995 | 0.4100 | 730 | 300 |
| 65 | Ni/Zn = 1/1 | Nb/Ta = 4/1 | 0.998 | 0.4225 | 715 | 260 |

Table 4 clearly shows that if the blend molar ratios of the components are within the ranges of preferred embodiments of the present invention, piezoelectric devices having satisfactory piezoelectric characteristics such as desirably high piezoelectric constant $d_{33}$ and high Curie temperature Tc can be obtained even in the cases where zinc, nickel-manganese, or nickel-zinc is used as the acceptor element $M^{II}$ instead of nickel or in the cases where antimony or niobium-tantalum is used as the donor element $M^V$ instead of niobium.

It is considered useful to use, as the acceptor element $M^{II}$, a divalent transition metal, such as cobalt, iron, chromium, or copper, having characteristics similar to nickel, zinc, or manganese. It is considered useful to use, as the donor element $M^V$, a pentavalent transition metal having characteristics similar to niobium, antimony, or tantalum. Note that it was found that the piezoelectric devices of Sample Nos. 62 to 65 containing nickel had a piezoelectric constant $d_{33}$ higher than that of Sample No. 61 that did not contain nickel as the acceptor element $M^{II}$.

EXAMPLE 5

Conductive pastes in which the blend ratios of the copper powder to the nickel powder were adjusted to those shown in Table 5 on a weight basis were prepared.

Ceramic green sheets having the same compositions as those of Sample No. 4 in Example 1 were also prepared.

Next, the conductive paste was used to conduct screen printing on the ceramic green sheets to form conductive layers of predetermined patterns. Piezoelectric devices of Sample Nos. 71 to 76 were then made by the same method and procedure as in Example 1, and the piezoelectric constant $d_{33}$ was measured.

Table 5 shows the ratio of the copper powder to the nickel powder (Cu/Ni ratio) in the conductive paste and the piezoelectric constants $d_{33}$.

TABLE 5

| Sample No. | Cu/Ni ratio | Piezoelectric constant $d_{33}$ (pm/V) |
|---|---|---|
| 71 | 100/0 | 705 |
| 72 | 98/2 | 720 |
| 73 | 90/10 | 755 |
| 74 | 85/15 | 790 |
| 75 | 70/30 | 795 |
| 76*** | 50/50 | — |

Triple asterisked sample is outside the range of the present invention (Claim 8).

It was found from Sample No. 76 that because the content of nickel more easily oxidizable than copper was 50 wt % (more than 30 wt %) of the metal component of the conductive paste, most nickel became oxidized during firing. As a result, the metal component in the internal electrodes 12a and 12b became excessively deficient, and the covering ratio of the internal electrodes 12a and 12b was decreased.

In contrast, satisfactory piezoelectric constants $d_{33}$ could be achieved from Sample Nos. 71 to 75. It was found that the piezoelectric constant $d_{33}$ could be further improved by increasing the nickel content in the internal electrodes. It was also found that the effect of increasing the piezoelectric constant $d_{33}$ was particularly notable at a Cu/Ni ratio of 85/15 or higher.

Piezoelectric devices of Sample No. 72 in which the Cu/Ni ratio was 98/2 and Sample No. 74 in which the Cu/Ni ratio was 85/15 were observed with a scanning electron micrometer (SEM) at a cross-section near the internal electrode, and the componential analysis was conducted by wavelength dispersive X-ray spectrometry (WDX).

Figure 3:
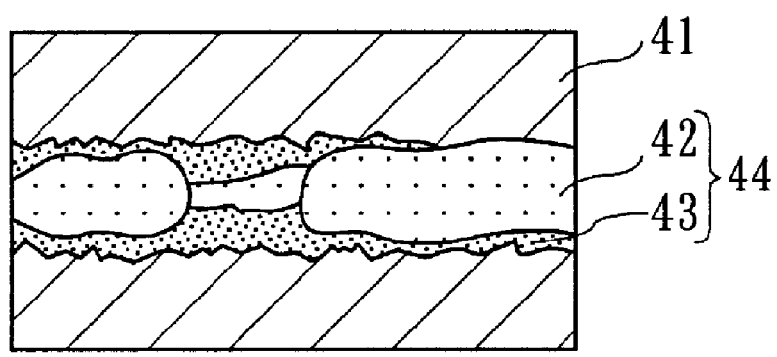
FIG. 3 is a cross-sectional view schematically showing a part of a piezoelectric device of Sample No. 72 near an internal electrode layer in Example 5.

FIG. 3 is a cross-sectional view schematically showing a cross-section near an internal electrode in Sample No. 72.

Figure 4:
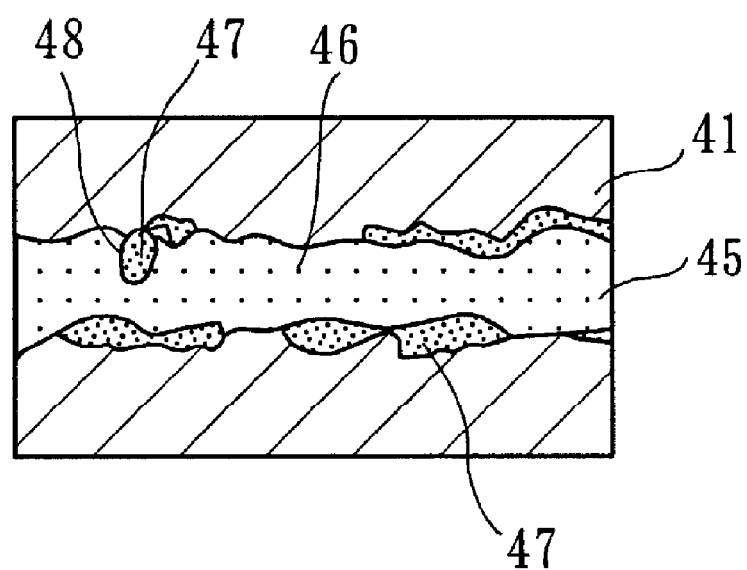
FIG. 4 is a cross-sectional view schematically showing a part of a piezoelectric device of Sample No. 74 near an internal electrode layer in Example 5.

FIG. 4 is a cross-sectional view schematically showing a cross-section near an internal electrode in Sample No. 74.

As shown in FIG. 3, in Sample No. 72 in which the nickel content was as low as 2 wt %, it was observed that a CuO phase 43 was formed in an internal electrode 44 around a copper-nickel alloy or a copper-nickel mixture 42. In the drawing, reference numeral 41 denotes a piezoelectric ceramic.

In contrast, in Sample No. 74 in which the nickel content was increased to 15 wt %, a copper phase 46 substantially composed of copper and a NiO phase 47 substantially composed of NiO were observed in an internal electrode 45. Most of the NiO phase 47 was distributed at the interface between the copper phase 46 and the piezoelectric ceramic 41, and part of the NiO phase 47 was also distributed inside a pore 48 formed in the copper phase 46. This is presumably because nickel, which is more easily oxidizable than copper and becomes oxidized before copper, forms NiO and diffuses into the piezoelectric ceramic 41 before CuO, thereby inhibiting diffusion of CuO into the piezoelectric ceramic 41.

The reason for the NiO phase 47 mostly distributing at the interface between the copper phase 46 and the piezoelectric ceramic 41 is presumably as follows. That is, since nickel is already contained in the piezoelectric ceramic 41, excessive diffusion of NiO into the piezoelectric ceramic 41 is suppressed, and NiO that could not diffuse into the piezoelectric ceramic 41 distributes at the interface between the copper phase 46 and the piezoelectric ceramic 41.

It should be noted that the pore 48 is probably formed due to a decrease in covering ratio of the copper phase 46. However, it was confirmed that even in such cases, the pore 48 was filled with the NiO phase 47.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric device formed by simultaneously firing a piezoelectric ceramic mainly composed of a perovskite complex oxide represented by general formula $ABO_3$ and electrodes mainly composed of copper, wherein the perovskite complex oxide contains lead in the A sites, and titanium, zirconium, an acceptor element $M^{II}$ comprising a divalent metal element, and a donor element $M^V$ comprising a pentavalent metal element in the B sites, and equations below are satisfied:

$$0.05 \leq z \leq 0.40$$

$$0 < bz/3 \leq 0.035$$

$$0.345 \leq x \leq 0.480$$

wherein z is the total molar content of the acceptor element $M^{II}$ and the donor element $M^V$ in the B sites, the blend molar ratio of the acceptor element $M^{II}$ to the donor element $M^V$ is 1:(2+b), and x is the molar content of titanium in the B sites.

2. The piezoelectric device according to claim 1, wherein the acceptor element $M^{II}$ contains at least one element selected from the group consisting of nickel, zinc, manganese, cobalt, iron, chromium, and copper.

3. The piezoelectric device according to claim 1, wherein the donor element $M^V$ contains at least one element selected from the group consisting of niobium, antimony, tantalum, and vanadium.

4. The piezoelectric device according to claim 1, wherein the electrodes are internal electrodes, and the piezoelectric device has a multilayer structure in which the internal electrodes and layers of the piezoelectric ceramic are alternately stacked.

5. The piezoelectric device according to claim 1, wherein the piezoelectric ceramic is represented by compositional formula:

$$Pb_{\alpha-a}Me_a[(M^{II}_{1/3}M^V_{(2+b)/3})_zTi_xZr_{1-x-z}]O_3$$

wherein Me represents a metal element, and α and a respectively satisfy equations:

$$0.965 \leq \alpha \leq 1.020$$

$$0 \leq a \leq 0.05.$$

6. The piezoelectric device according to claim 5, wherein the metal element Me contains at least one element selected from the group consisting of barium, strontium, calcium, scandium, yttrium, lanthanum, neodymium, and bismuth.

7. The piezoelectric device according to claim 1, wherein the electrodes contain nickel.

8. The piezoelectric device according to claim 7, wherein the electrodes are formed of a sintered conductive paste that has a copper content of about 70 wt % or more and about 90 wt % or less in the metal component and a nickel content of about 10 wt % or more and about 30 wt % or less in the metal component, wherein the total content of copper and nickel is about 100 wt % or less.

9. The piezoelectric device according to claim 7, wherein, in the electrodes, a copper phase substantially composed of copper is present and a NiO phase is present in one or both of an interface between the copper phase and the piezoelectric ceramic and a pore formed in the copper phase.

10. The piezoelectric device according to claim 7, wherein the acceptor element $M^{II}$ at least contains nickel.

* * * * *